United States Patent
Huang et al.

(10) Patent No.: US 6,495,912 B1
(45) Date of Patent: Dec. 17, 2002

(54) STRUCTURE OF CERAMIC PACKAGE WITH INTEGRATED PASSIVE DEVICES

(75) Inventors: Ching-Cheng Huang, Hsinchu (TW); Mou-Shiung Lin, Hsinchu (TW); Jin-Yuan Lee, Hsin-Chu (TW)

(73) Assignee: Megic Corporation, Hsin-Chu (TW)

( * ) Notice: Subject to any disclaimer, the term of this patent is extended or adjusted under 35 U.S.C. 154(b) by 0 days.

(21) Appl. No.: 09/953,610

(22) Filed: Sep. 17, 2001

(51) Int. Cl.[7] .................. H01L 23/053; H01L 23/12
(52) U.S. Cl. .................. 257/700; 257/703; 257/706; 257/707; 438/125
(58) Field of Search .................. 257/700, 703, 257/706, 707; 438/125

(56) References Cited

U.S. PATENT DOCUMENTS

| | | | |
|---|---|---|---|
| 4,328,531 A | * 5/1982 | Nagashima et al. | 361/401 |
| 4,519,872 A | * 5/1985 | Anderson, Jr. et al. | 156/643 |
| 5,475,263 A | * 12/1995 | Coady et al. | 257/700 |
| 5,633,783 A | * 5/1997 | Yamamoto | 361/704 |
| 5,635,429 A | * 6/1997 | Grogen et al. | 501/87 |
| 5,795,799 A | * 8/1998 | Hosoya | 438/126 |
| 5,854,534 A | 12/1998 | Beilin et al. | 257/691 |
| 6,015,722 A | 1/2000 | Banks et al. | 438/108 |
| 6,108,212 A | 8/2000 | Loch et al. | 361/768 |
| 6,136,419 A | * 10/2000 | Fasano et al. | 428/210 |
| 6,143,401 A | 11/2000 | Fischer et al. | 428/322.7 |

* cited by examiner

Primary Examiner—David Nelms
Assistant Examiner—Tu-Tu Ho
(74) Attorney, Agent, or Firm—George O. Saile; Stephen B. Ackerman

(57) ABSTRACT

A new method and structure is provided to create a System On Package (SOP). The process starts with a ceramic substrate that is typically used as the basis for a ceramic substrate. One or more layers of dielectric such as polyimide are deposited over the surface of the ceramic substrate, patterned and etched to created openings in the one or more layers of dielectric that align with conductive plugs that have been provided in the ceramic substrate. Passive components and metal interconnections can be created on the surface of the layers of dielectric using thin film technology. As a final step, a protective layer of dielectric is deposited over the surface of the top layer of dielectric. Active semiconductor devices may be attached to the surface of the SOP, heat sinks can be attached to the semiconductor devices. The SOP may further be mounted on the surface of a Printed Circuit Board.

38 Claims, 11 Drawing Sheets

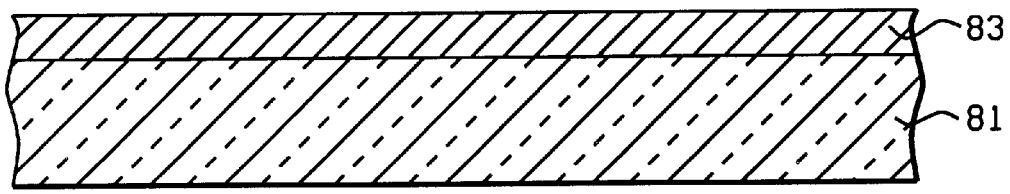
*FIG. 18A – Prior Art*
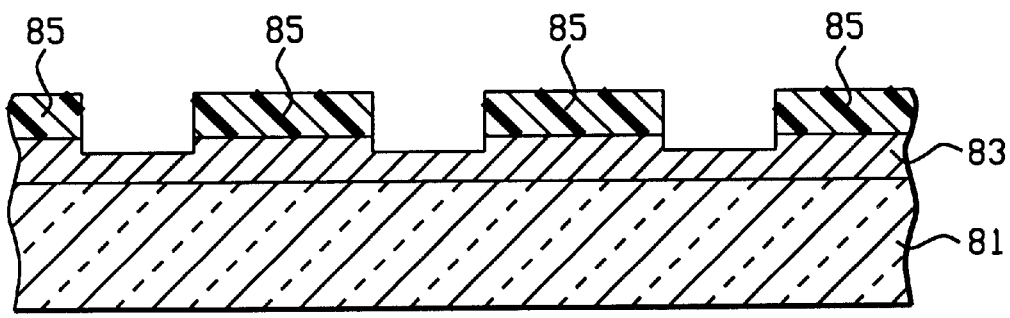
*FIG. 18B – Prior Art*
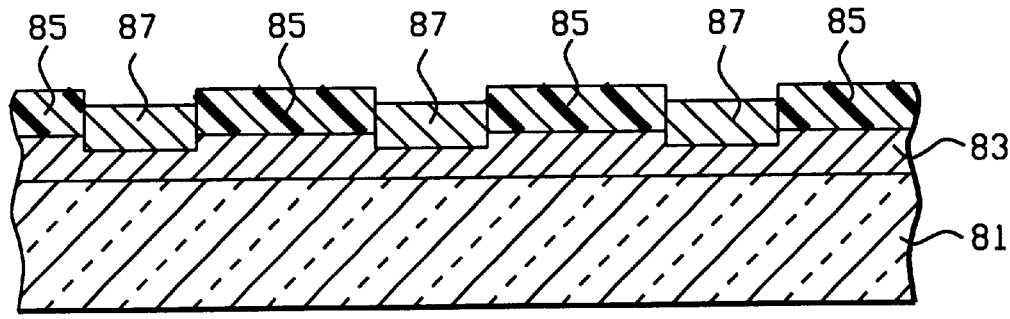
*FIG. 18C – Prior Art*

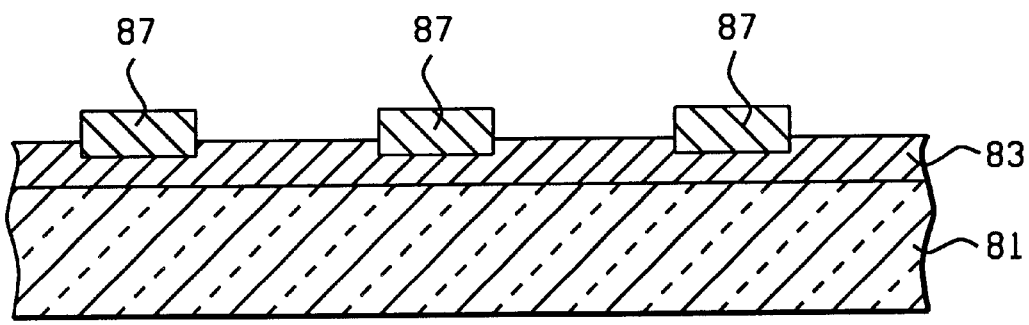
*FIG. 18D - Prior Art*
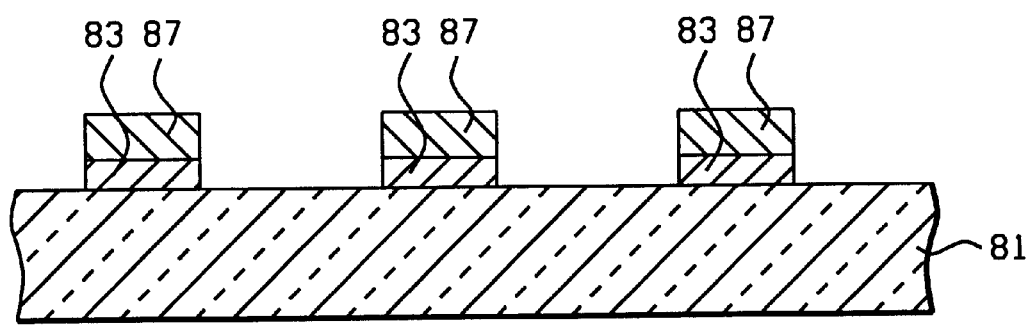
*FIG. 18E - Prior Art*

STRUCTURE OF CERAMIC PACKAGE WITH INTEGRATED PASSIVE DEVICES

BACKGROUND OF THE INVENTION (1) Field of the Invention

The invention relates to the fabrication of integrated circuit devices, and more particularly, to a method and structure for System On Package (SOP) applications using ceramic as a base packaging medium.

(2) Description of the Prior Art

The art of semiconductor device creation has, since its inception, been characterized by a rapid creation of new technologies and by the development of new and improved methods of using existing processes and materials. The main emphasis during this period of growth has been to achieve improvements in device performance, which in most cases is achieved by reducing the size of device elements to the maximum extent possible. With this reduction in size has come a continuing increase in device density and the creation of more complex devices that provide more complex functions at competitive prices.

The evolutionary process of the semiconductor technology has not been limited to addressing numerous aspects of the creation of semiconductor devices, this process has also had a significant impact on the method in which the semiconductor devices are packaged. Numerous new packaging approaches have been developed over the years by not only creating supporting units or packages that can contain one or more semiconductor devices but by in addition adapting these devices so that they can be readily mounted in a particular package. This has led to many configurations of integrated circuit devices such as Ball Grid Array (BGA), Land Grid Array (LGA) and Pin Grid Array (PGA), Chip Scale Packaging (CSP) and Quad Flat Pack (QFP) devices. A number of approaches in packaging semiconductor devices use plastic packaged modules of the type wherein the contact zones of the chip are connected by wire bonding to lead conductors and wherein the chip is molded in etch resistant resins. Other applications use unpackaged or bare semiconductor die to construct multi chip modules and other electronic devices. Packages that can be used to package IC die can be identified among others as thin quad flat packages (TQFP's), ball grid arrays (BGA's), tape automated bonding (TAB), ultra-thin packages, bare chips and chip on board (COB), flip-chip assemblies and multichip modules (MCM's).

In the field of high density interconnect technology, many integrated circuit chips are physically and electrically connected to a single substrate commonly referred to as a multi-chip chip module (MCM). To achieve a high wiring and packing density, it is necessary to fabricate a multilayer structure on the substrate to connect integrated circuits to one another. Typically, metal power and ground planes in the substrate are separated by layers of a dielectric such as a polyimide. Embedded in other dielectric layers are metal conductor lines with vias (holes or conductive plugs) providing electrical connections between signal lines or to the metal power and ground planes.

From the above it is clear that a significant effort of the semiconductor industry is aimed at providing the maximum number of functional components while these components are packaged in a minimum amount of space. This leads to the effort of providing complete system functions in one package, whereby the concept of system implies that the function that is provided by the package extends considerably from what is typically considered the function of a semiconductor device. The System On Package (SOP) application addresses not only the packaging of active semiconductor devices but includes the packaging of passive electrical components such as resistors, capacitors and inductors. The invention addresses such a SOP package, using ceramic as a base packaging medium.

U.S. Pat. No. 6,108,212 (Lach et al.) shows a package with passive elements (capacitor and resistors).

U.S. Pat. No. 6,143,401 (Fischer et al.) U.S. Pat. No. 5,854,534 (Beilin et al.) and U.S. Pat. No. 6,015,722 (Banks et al.) show related packages.

SUMMARY OF THE INVENTION

A principle objective of the invention is to provide a method that allows for a higher Input/Output (I/O) pin count over a given substrate area by applying a grid area array approach as opposed to a peripheral area approach.

Another objective of the invention is to, for a given component configuration, reduce the required substrate area by using backside I/O ball interconnects, thereby not allocating substrate surface area to individual electrical components.

Yet another objective of the invention is to provide a method of packaging semiconductor devices whereby these devices are packaged face up, thereby providing improved heat dissipation for the device and providing a means for easy interfacing with an additional heat spreader or heat sink.

A sill further objective of the invention is to provide a standard structure for the implementation of System On Package applications, the standard structure can be personalized using thin film processing technology.

In accordance with the objectives of the invention, a new method and structure is provided to create a System On Package (SOP). The process starts with a green sheet that is typically used as the basis for a ceramic substrate. One or more layers of dielectric such as polyimide are deposited over the surface of the ceramic substrate, patterned and etched to created openings in the one or more layers of dielectric that align with conductive plugs that have been provided in the ceramic substrate. Passive components and metal interconnections can be created on the surface of the layers of dielectric using thin film technology. As a final step, a protective layer of dielectric is deposited over the surface of the top layer of dielectric. Active semiconductor devices may be attached to the surface of the SOP, heat sinks can be attached to the semiconductor devices. The SOP may further be mounted on the surface of a Printed Circuit Board or may be connected to a connector of a card or module with metal fingers being connected with points of electrical contact provided in a connector of the card or module.

BRIEF DESCRIPTION OF THE DRAWINGS

FIG. 11 shows a cross section of a ceramic substrate, metal plugs have been provided through the ceramic substrate, the metal plugs are connected to contact balls.

FIG. 12 shows a cross section of a ceramic substrate, metal plugs have been provided through the ceramic substrate, the metal plugs are connected to metal pins.

FIG. 13 shows a cross section of a ceramic substrate, metal plugs have been provided through the ceramic substrate, the metal plugs are at this timer not further connected creating an array of through holes that are available for further interconnection, metal fingers are connected to the ceramic substrate.

FIGS. 18a through 18e highlight the prior art thin film process, which is applied during the implementation of the invention.

DESCRIPTION OF THE PREFERRED EMBODIMENTS

For typical System On Package applications, the approach of using Printed Circuit Boards (PCB) places severe restrictions on the interconnect pitch of the available I/O points that can be achieved. A SOP can be created using a silicon substrate as a base layer, however silicon is relatively expensive. These problems are circumvented by using ceramic thin film processing for the creation of the SOP. If ceramic is used as a base substrate and the contact points to the package, in the form of solder balls, are placed on the same side as where the active components are mounted, then the I/O pin count is limited while this approach further results in inefficient use of available surface space. The invention addresses these concerns by:

integrating methods of thin film technology and the creation of passive components (such as resistors, inductors, capacitors and metal interconnects) with the placement of integrated circuit (IC) devices, using a ceramic substrate as the base layer for the SOP placing the I/O interconnects to the SOP on the underside of the SOP, that is the side that is opposed to the side of the SOP on which the active devices of the package are mounted providing a method to standardize a ceramic substrate, whereby thin film technology is used in combination with the ceramic package for the creation of SOP.

The following comments apply to the use of a Printed circuit Board as a substrate to create a System On Package:

PCB's are cost competitive

PCB's do not lend themselves to thin film technology in view of the poor planarity of PCB's while the coefficient of thermal expansion of a PCB is relatively large, causing severe thermal mismatch between the PCB and overlying constructs PCB's are prone to warping and other deformations, dependent on environmental conditions such as humidity and heat PCB's are only suitable for the mounting of discrete passive components on the surface thereof.

Figure 1:
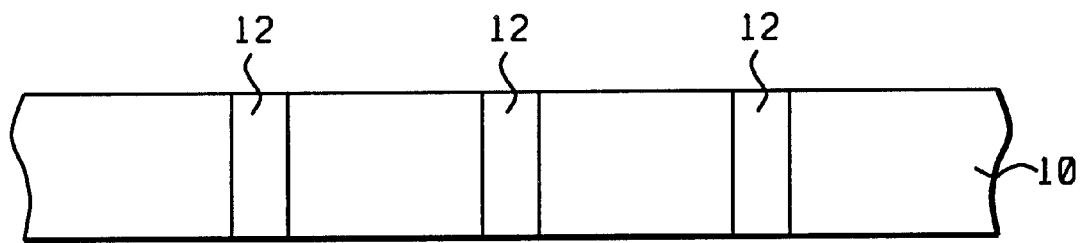
FIG. 1 shows the cross section of a green sheet used for ceramic substrates, openings have been created in the layer of green sheet.
Figure 2:
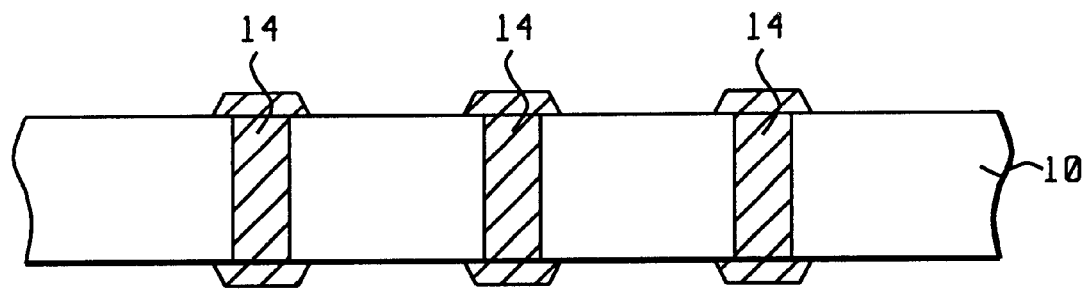
FIG. 2 shows a cross section after the openings in the ceramic substrate have been filled with a metal.

Referring now specifically to FIG. 1, there is shown a cross section of a green sheet 10 used for ceramic substrates, openings 12 have been created in the layer of ceramic substrate. FIG. 2 shows how the openings 12 in the green sheet 10 have been filled with a metal paste after which co-sintering is performed with the green sheet to form the metal plug. The creation of the metal plugs 14 through the ceramic substrate 10 can also use conventional methods of electroless plating combined with electro plating. The layer of metal (not shown in FIG. 2) that is electroplated over the surface of the ceramic substrate 10 is patterned and etched to created the (surfaces of, protruding from) metal plugs 14.

Figure 3:
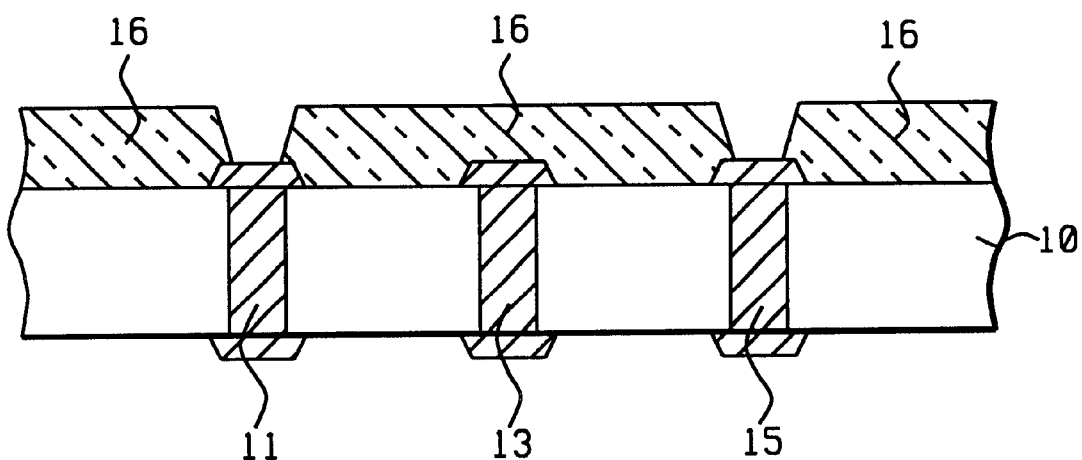
FIG. 3 shows a cross section after a first layer of polyimide has been deposited.

FIG. 3 shows a cross section after a first layer 16 of polyimide has been deposited. Openings have been created through layer 16 of polyimide, partially exposing the surface of metal plugs 14 (FIG. 2). It must be noted that these openings expose only the surface of plugs 11 and 15. This is symptomatic of the flexibility that is-provided by the invention. The processing that is done under the invention, such as creating openings in a layer of polyimide, can be personalized to fit and suit a particular design of a SOP. The features that are shown in the following drawings can be created in any manner and sequence that is suitable for a given SOP, these features as shown are therefore merely examples and in no way limit the invention.

Figure 4:
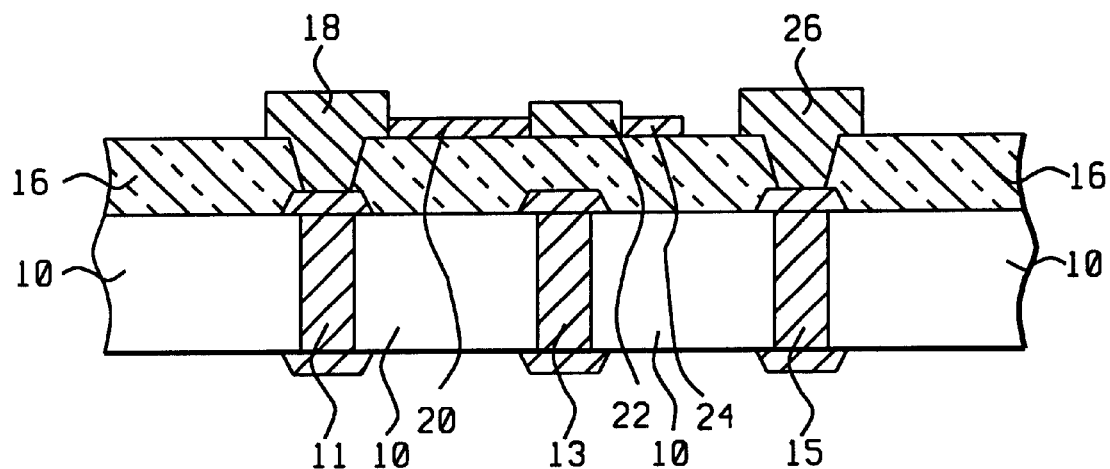
FIG. 4 shows a cross section after a resistor has been formed on the surface of the first layer of polyimide, contact plugs have been formed.

FIG. 4 shows a cross section after a resistor 22 has been formed on the surface of the first layer 16 of polyimide. This resistor 22 is connected to plug 18, which has been created overlying and in contact with conductive plug 11. Resistor 22 is connected to plug 18 by means of a conventional interconnect metal line 20. Line 24 is a metal interconnect that is at a later time used to connect the resistor to surrounding circuitry. The elements 20, 22 and 24 can all be created using thin film technology. This provides the required design freedom and flexibility of creating any network of interconnect metal that is required by a particular SOP. In summary: all elements that have been shown, that is 18 (a metal plug), 20 (metal interconnect line), 22 (a resistor), 24 (metal interconnect line) and 26 (metal plug) are shown as examples and can be replaced with design-specific elements. Plugs 18 and 26 are created using conventional methods of photolithography, patterning and etching followed by metal deposition and polishing. For best results the thin film elements (such as 20, 22 and 24) are created first, followed by the creation of metal plugs (such as plugs 18 and 26) that connect with underlying points of electrical contact.

Figure 5:
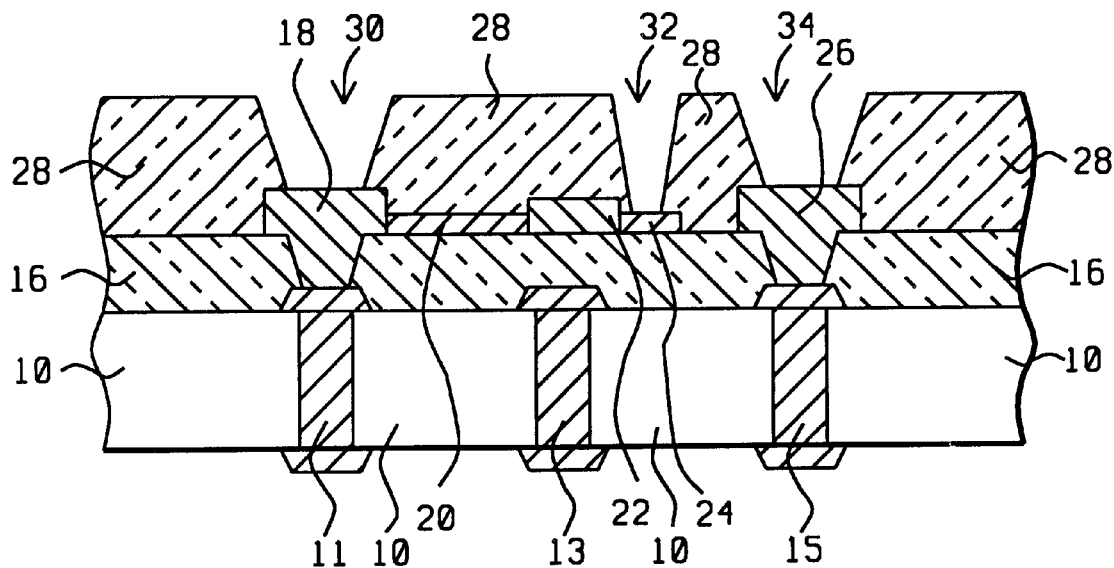
FIG. 5 shows a cross section after a second layer of polyimide has been deposited.

FIG. 5 shows a cross section whereby a second layer 28 of polyimide has been deposited. An opening 32 has been created in the second layer 28 of polyimide that exposes the surface of interconnect metal 24, other openings 30 and 34 have at the same time been created in the second layer 28 of polyimide, respectively exposing the surface of metal plugs 18 and 26.

Figure 6:
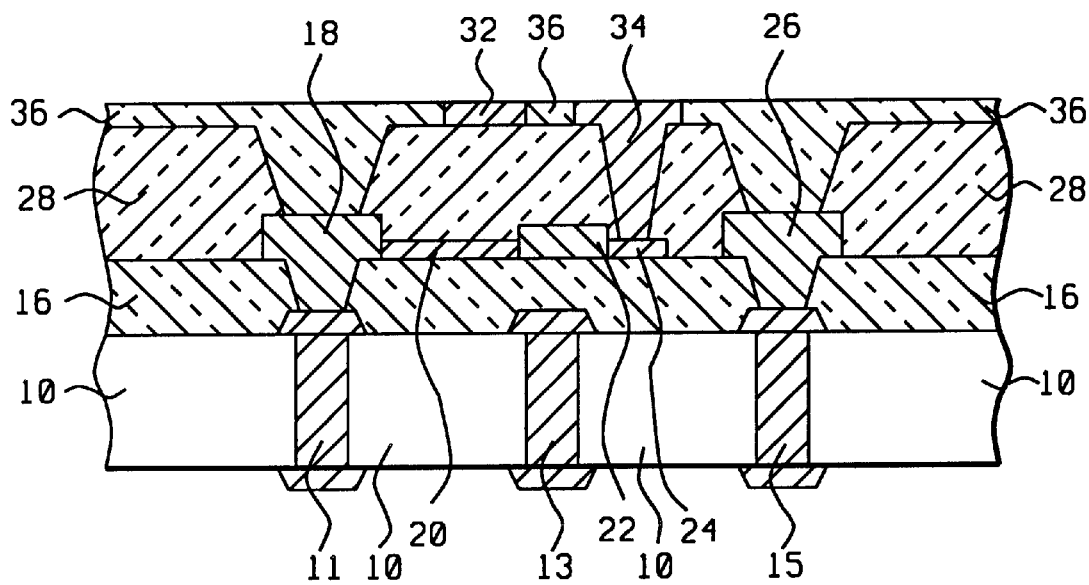
FIG. 6 shows a cross section after a layer of dielectric has been deposited, the layer of dielectric has been patterned and etched creating openings for a lower electrode of a capacitor and a metal plug that connects to the previously created resistor.

FIG. 6 shows a cross section after a layer 36 of dielectric has been deposited. The layer 36 of dielectric has been patterned and etched creating an opening for a lower electrode 32 of a capacitor and metal plug 34 that connects to the previously created metal interconnect 24 of resistor 22. After the two indicated openings have been created, a layer of metal is deposited over the surface of the layer 36 of dielectric, filling the openings for the first electrode 32 of a capacitor and the opening for metal plug 34. The surface of the deposited layer of metal is then polished down to the surface of the layer 36 of dielectric.

Figure 7:
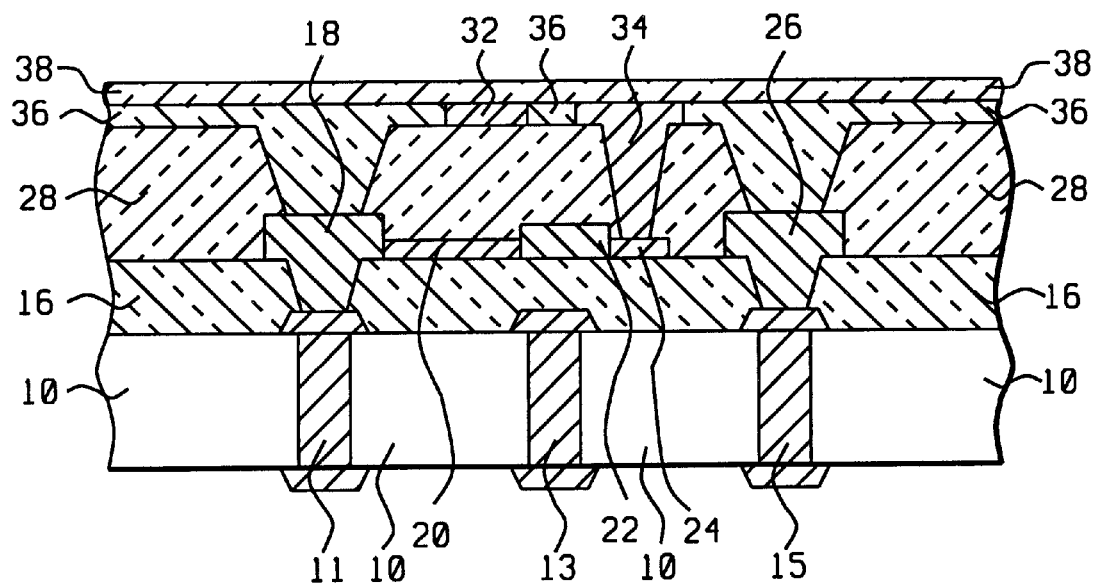
FIG. 7 shows a cross section after a layer of capacitor dielectric has been deposited over the surface of the layer of dielectric.
Figure 8:
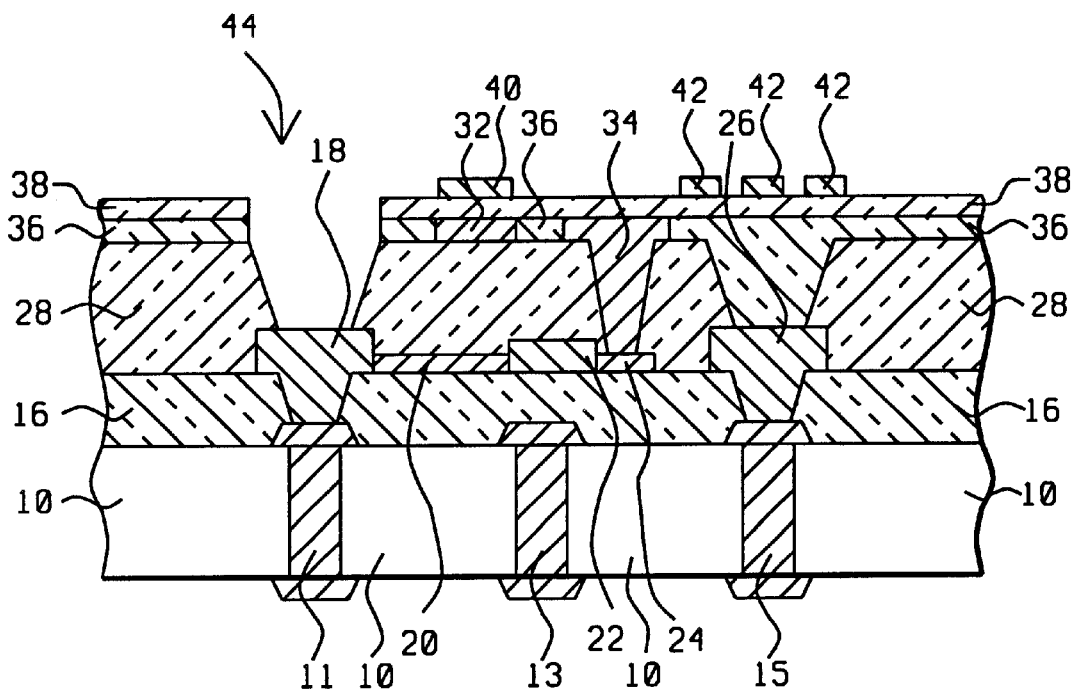
FIG. 8 shows a cross section after a second electrode has been created that aligns with the first electrode of a capacitor, an opening has been created in the layer of dielectric that exposes an underlying point of electrical contact. In addition, an inductor has been created on the surface of the layer of capacitor dielectric.

FIG. 7 shows a cross section after a layer 38 of capacitor dielectric has been deposited over the surface of layer 36 of dielectric. This is followed by, FIG. 8, the creation of a second electrode 40, the second electrode aligns with the first electrode 32 of a capacitor. An opening 44 has been created in the layer 28 of dielectric that exposes the underlying point 18 of electrical contact. In addition, an inductor 42 has been created on the surface of the layer 38 of capacitor dielectric.

It is envisioned that, for the creation of a SOP of the invention, the thin film technology will be predominantly used for the creation of relatively thin layers of interconnect metal such as the highlighted metal layers 20, 22 and 24. Other layers of metal, such as layers 40 and 42, are expected to be created using conventional methods of photolithography, patterning and etching.

The second electrode 40 of a capacitor and the inductor 42 can be created in one processing sequence of depositing a layer of dielectric (not shown in FIG. 8) over the surface of the layer 38 of capacitor dielectric, patterning the layer of dielectric to create openings in the layer of dielectric that align with the elements 40 and 42, depositing a layer of metal over the layer of dielectric, polishing the layer of metal down to the surface of the layer of dielectric (creating the elements 40 and 42) after which the layer of dielectric can be removed or can be left in place to become part of the next layer of polyimide that is deposited. After this metal pattern has been created, opening 44 can be etched through layers 38, 36 and 28 of dielectric, exposing the surface of metal plug 18 and making this surface available for further interconnect.

Figure 9:
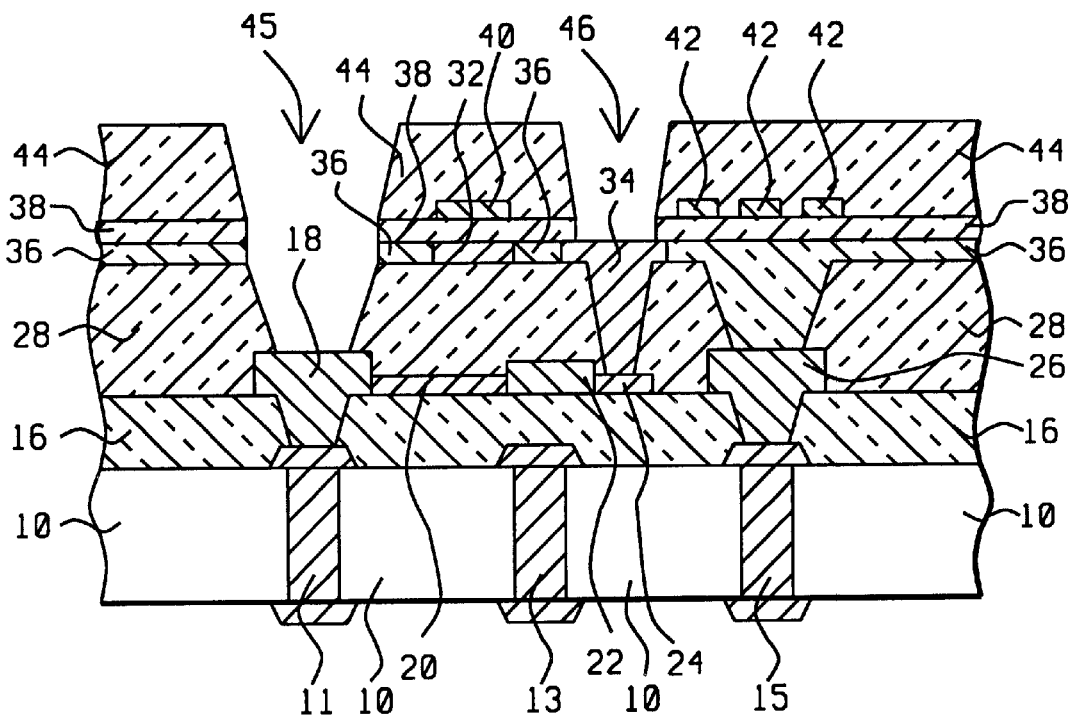
FIG. 9 shows a cross section after a third layer of polyimide has been deposited, openings have been created in the third layer of polyimide that expose underlying points of electrical contact.

FIG. 9 shows a cross section after a third layer 44 of polyimide has been deposited over the surface of the layer of capacitor dielectric, openings 45 and 46 have been created in the third layer 44 of polyimide that expose underlying points of electrical contact 18 and 34. The exposure of contact points 18 and 34 makes these contact points available for further interconnection to surrounding electrical circuitry or components.

Figure 10:
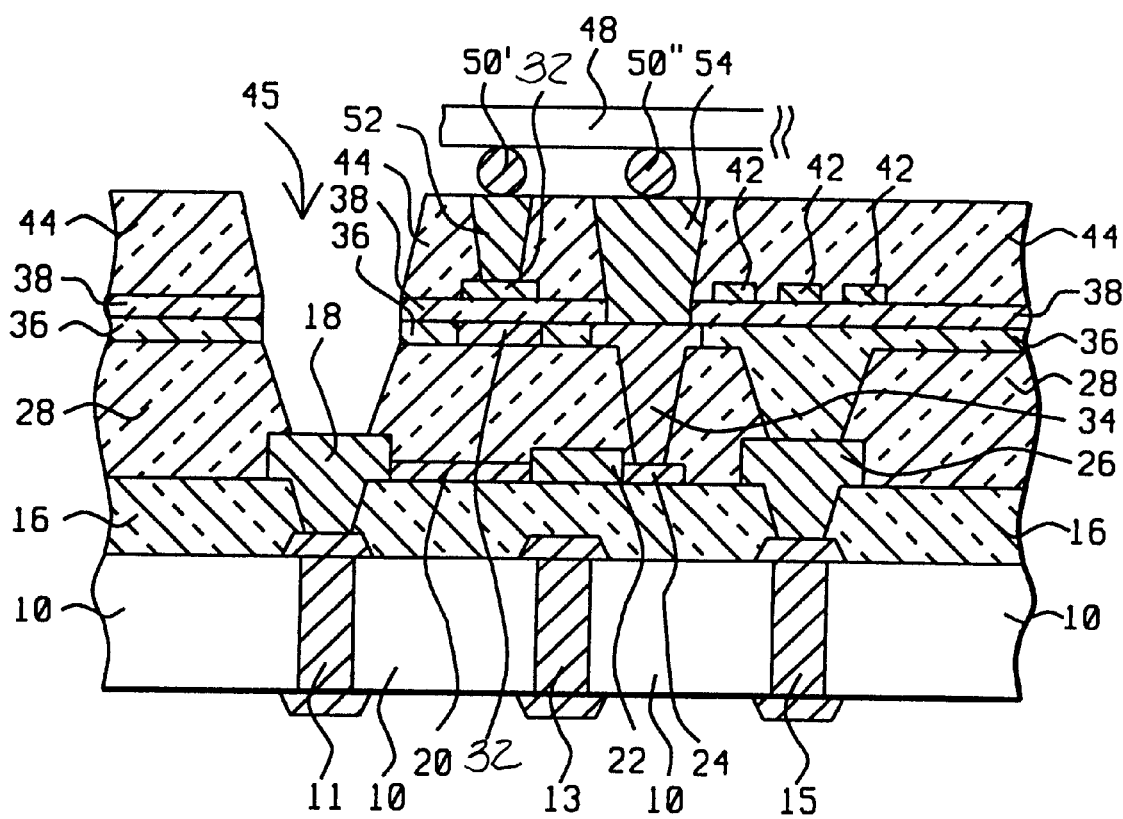
FIG. 10 shows a cross section after an active semiconductor device has been attached over the surface of the third layer of polyimide.

FIG. 10 shows a cross section after an active semiconductor device 48 has been attached over the surface of the third layer 44 of polyimide. A metal plug 52 has been created through the third layer 44 of polyimide which enables the connection of one of the contact balls 50' of the active device 48 to be connected to the second electrode 40 of a capacitor. The opening 46 (FIG. 9) has been filled with metal, establishing a path of electrical conduction between the resistor 22 and a second contact ball 50" of the active device 48, this by means of plug 54, plug 34 and interconnect metal 24.

As previously stated, it must again be emphasized that the particular elements that have been used in the example creation of a SOP and as shown in FIGS. 1 though 10 can be varied in any way and can be adapted to any particular design of a SOP. Basic is that the SOP is created overlying a ceramic substrate, that layers of polyimide are deposited over a first surface of the ceramic substrate, that passive components are created on the surfaces of the deposited layer of polyimide, that at least one active semiconductor device can be mounted over the surface of the layers of polyimide, that thin film technology is used to create metal patterns on the surface of the layers of polyimide, that a second surface of the ceramic substrate remains available for interconnect of the SOP to surrounding circuitry. The methods that can be applied for this latter interconnect are shown in cross section in FIGS. 11 through 13.

Figure 11:
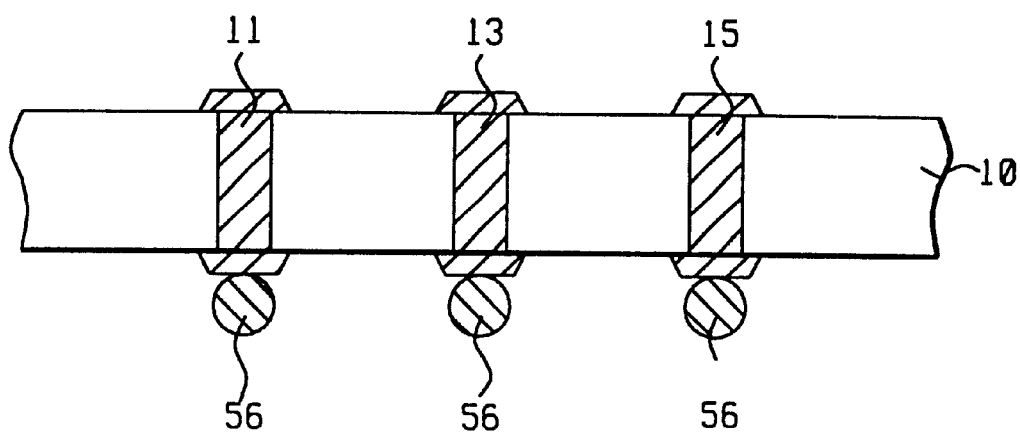
FIGS. 11 through 13 show three methods of establishing contact to the metal plugs that have been provided in the ceramic substrate, as follows.

FIG. 11 shows a cross section of a ceramic substrate 10, metal plugs 11, 13 and 15 have been provided through the ceramic substrate 10, the metal plugs are connected to contact balls 56.

Figure 12:
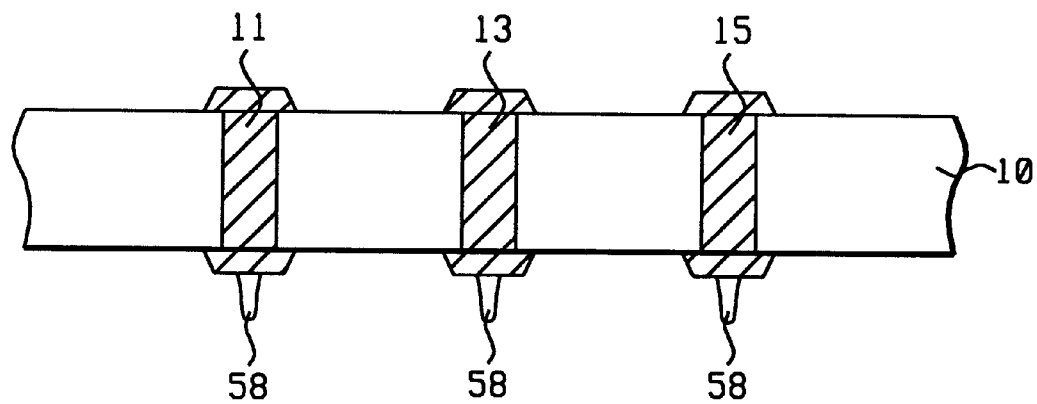

FIG. 12 shows a cross section of a ceramic substrate 10, metal plugs 11, 13 and 15 have been provided through the ceramic substrate 10, the metal plugs are connected to metal pins 58.

Figure 13:
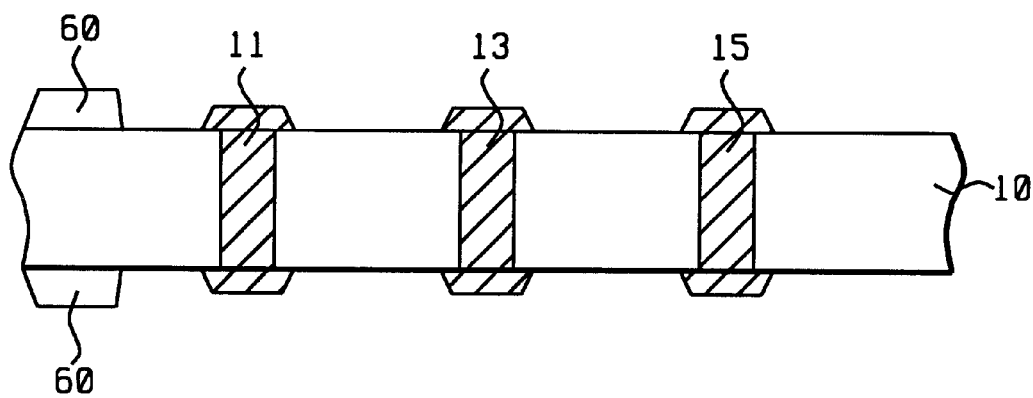

FIG. 13 shows a cross section of a ceramic substrate, metal plugs 11, 13 and 15 have been provided through the ceramic substrate 10, metal fingers 60 are connected to the ceramic substrate. The metal plugs 11, 13 and 15 have been provided with additional interconnect to connect metal fingers 60 for further interconnection to surrounding circuitry.

Figure 14:
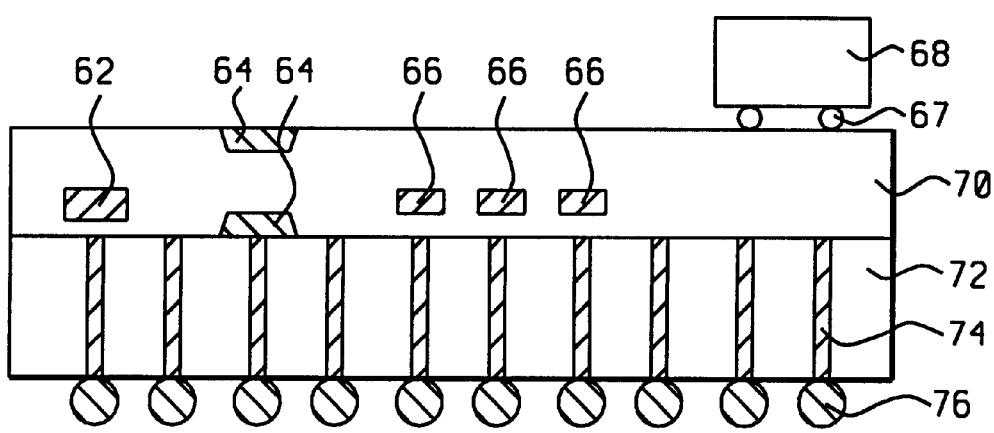
FIG. 14 shows a cross section of a SOP, passive components that are provided in the layer overlying the ceramic substrate are highlighted, an active semiconductor device is connected to the surface of the layer overlying the ceramic substrate. The contact plugs that have been provided through the ceramic substrate are connected to contact balls forming a ball grid array. The SOP may further be mounted on the surface of a Printed Circuit Board or may be connected to a connector of a card or module with metal fingers being connected with points of electrical contact provided in a connector of the card or module.

FIG. 14 shows a cross section of a SOP, passive components that are provided in the layer overlying the ceramic substrate are highlighted, an active semiconductor device is connected to the surface of the layer overlying the ceramic substrate, the contact plugs that have been provided through the ceramic substrate are connected to contact balls forming a ball grid array. The following elements are highlighted in the cross section that is shown in FIG. 14:

62, a resistor
64, a capacitor 66, an inductor 67, contact balls between an active semiconductor device and the SOP of the invention 68, an active semiconductor device 70, a composite layer of thin-film dielectric in which are created the passive components (resistors, capacitors, inductors) and the interconnect metal 72, the ceramic substrate 74, the metal plugs or through holes that are provided through the ceramic substrate 72

76, a Ball Grid Array of interconnects to the SOP of the invention.

Figure 15:
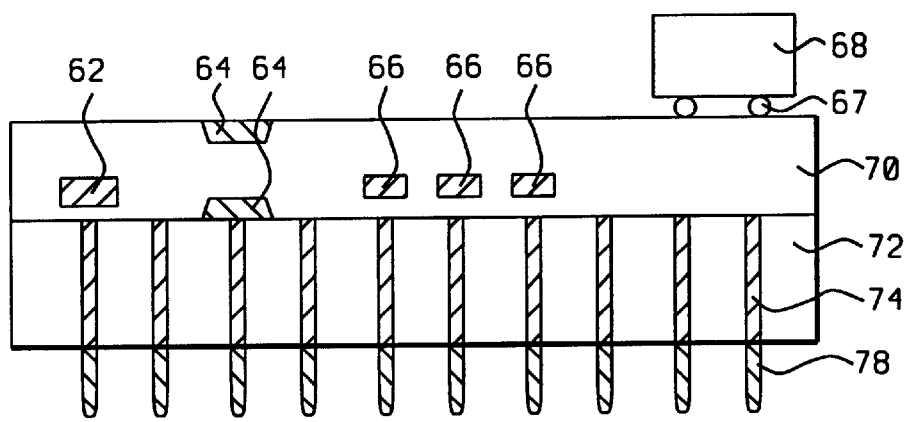
FIG. 15 shows a cross section that is similar to the cross section that is shown in FIG. 14, the contact plugs that have been provided through the ceramic substrate are connected to metal pins forming a pin grid array.

FIG. 15 shows a cross section that is similar to the cross section that is shown in FIG. 14, the contact plugs that have been provided through the ceramic substrate are connected to metal pins 78 forming a pin grid array.

Figure 16:
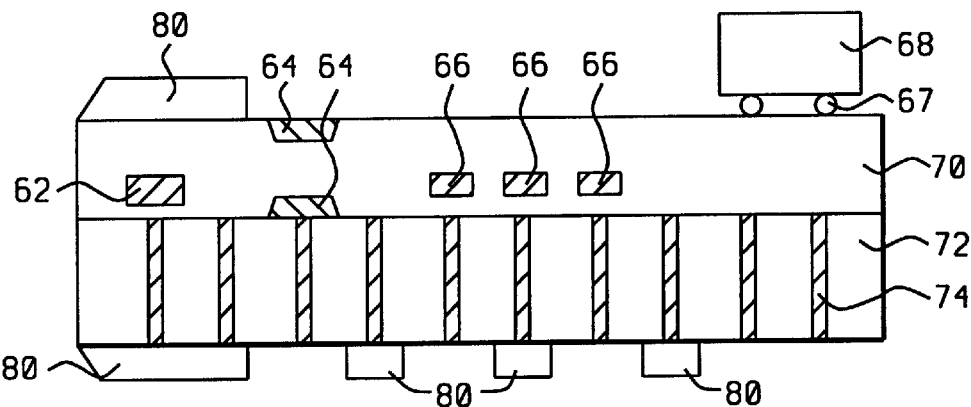
FIG. 16 shows a cross section that is similar to the cross section that is shown in FIG. 14, the contact plugs that have been provided through the ceramic substrate are not connected to any elements that are part of the SOP. The contact plugs form a through hole array and form necessary interconnects to metal fingers to thereby further connect to surrounding electronic components or circuitry.

FIG. 16 shows a cross section that is similar to the cross section that is shown in FIG. 14. The contact plugs 74 that have been provided through the ceramic substrate 72 are connected to metal fingers 80. The metal fingers 80 provide connectivity to surrounding electronic components or circuitry. The metal fingers are formed of gold, tin or the like and serve the same function as balls 76 or pins 78 of FIGS. 14 and 15 respectively.

It is clear that the surface of layer 70, the composite layer of thin-film dielectric, has been provided with points of electrical contact such as points 52, 54 and 45 that have been shown in cross section in FIG. 10. The points of electrical contact have not been shown in FIGS. 14 through 16 in order to keep these figures relatively simple.

Metal fingers 80 can be connected to points of electrical contact provided in the first surface of the ceramic substrate.

Figure 17:
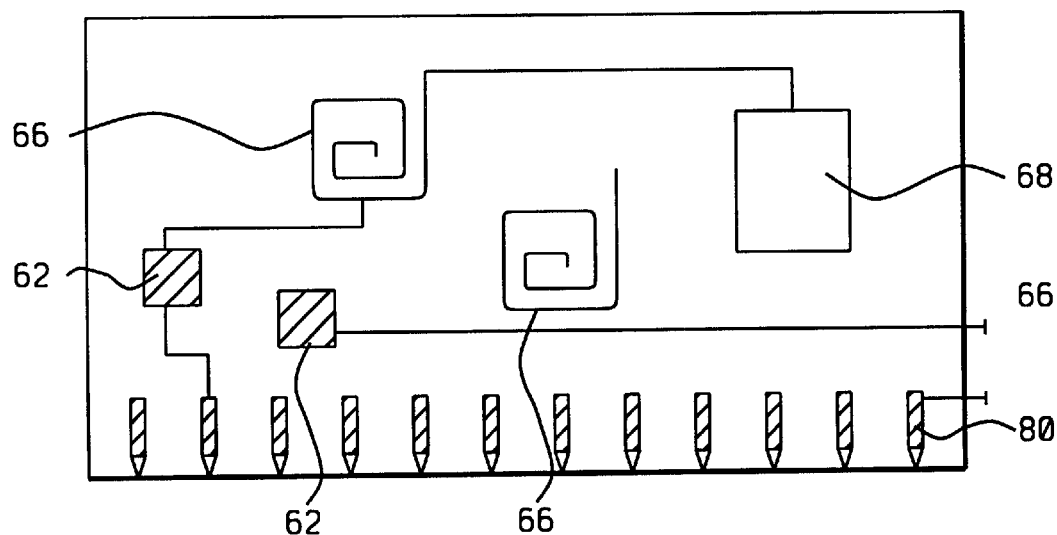
FIG. 17 shows a top view of the cross section that is shown in FIG. 16, components that are part of the SOP have been highlighted.

FIG. 17 shows a top view of FIG. 16, components that are part of the SOP 82 have previously been highlighted in FIG. 16. Note that metal fingers 80 provide a connectivity which is, for example, similar to that which is used in DRAM memory cards for personal computers and the like.

For the understanding of the invention it is of importance to understand thin film technology. This is further discussed using FIGS. 18a through 18f.

The creation of metal patterns using thin film technology starts with a layer of dielectric, in the case of the invention this dielectric would be the first (16), second (28), third (44) layer of polyimide and the layer (36) that have been highlighted above. Therefore, where the term "dielectric" is used in the following discussion this term refers without distinction to one of these layers. These layers of dielectric are, in accordance with the invention, used for the creation of interconnect metal therein or thereover, such as for instance interconnect lines or a layer for a resistor or a layer for a capacitor (plate or electrode) or a layer for the creation of an inductor. This creation of interconnect metal is separate from creating openings through layers of dielectric whereby these openings are at a later time filled with a metal for making points of electrical interconnect available, in most instances making available surfaces of interconnect plugs.

To return to the thin film process, the thin film deposition technique contains the following steps, see FIGS. 18a through 18e:

the thin film process starts with a layer 81 of dielectric (see notes above regarding the nature of this layer of dielectric for the application of the invention), see FIG. 18a an interconnect plating base 83, FIG. 18a, is deposited over the surface of a layer of dielectric 81 by consecutive sputtering of for instance a first layer of Cr, a first layer of Au and a second layer of Cr a layer 85 of photoresist is deposited over the surface of the interconnect plating base 83, this layer 85 of photoresist is patterned and developed, creating openings in the layer of photoresist of the metal pattern that is to be created overlying the surface of dielectric layer 81; in other words: the pattern of photoresist that is developed (removed from the surface of the plating base 83) is identical to the pattern of metal that is to be created over the surface of layer 81 of dielectric; FIG. 18b the second layer of Cr is etched, exposing the first layer of Au, FIG. 18b; this is shown in FIG. 18b by a slight lowering of the surface of layer 83 bounded by the openings that have been created in the layer 85 of photoresist a semi-additive plating 87 of the interconnect pattern is deposited by depositing a second layer of Au, a first layer of Ni and a first layer of Cu, this is layer 87 in FIG. 18c the patterned layer 85 of photoresist is removed (FIG. 18d); the layer 85 of photoresist was used, as indicated, as a mask for the semi-additive plating of the interconnect pattern; the sputtered plating base 83 is wet etched, removing the sputtered plating base 83 between the interconnect pattern 87 as shown in the cross section of FIG. 18e.

At this time in the thin film process, the metal pattern 87 has been created on the surface of layer 81 of dielectric. After the creation of the metal pattern 87 has been completed, the creation of the SOP of the invention continues as previously highlighted, that is with the deposition of a layer of dielectric over the surface of the created interconnect metal, for instance the deposition of layer 28 after metal patterns 20, 22 and 24 have been created. Thin film technology does not apply to the creation of plugs 18 and 26 in layer 16 of polyimide.

To connect the thin film process with the invention and referring to FIG. 9, which shows an almost complete SOP that has been shown as an example, the thin film method of creating metal patterns is used to create layers 20, 22, 24 and can conceivably be used for the creation of layers 32, 40 and 42. The other interconnect metal that is shown in cross section in FIG. 9 are interconnect plugs which are created by creating openings in one of the layers of polyimide and filling these openings with metal using conventional methods of metal deposition and polishing.

For some of the creations of interconnect metal, the above indicated sequence can be performed in a better way. For instance, the creation of the lower capacitor plate 32 (FIG. 9) and the interconnect plug 34 can optimally be performed at one and the same time. If however, overlying the second layer 28 of polyimide, a layer of interconnect metal must be created (not shown in FIG. 9) then this layer of interconnect layer is preferably created using thin film technology.

The latter comments can best be summarized by stating that for most of the creations of interconnect metal, thin film technology is the preferred method. Metal plugs that are created through layers of dielectric use conventional methods of photolithography and metal deposition and polishing. There may be instances, such as the creation of layer 40 and 42, FIG. 9, where the latter approach is used in preference over thin film technology for the creation of these metal patterns on the surface of a layer of dielectric.

Figure 19:
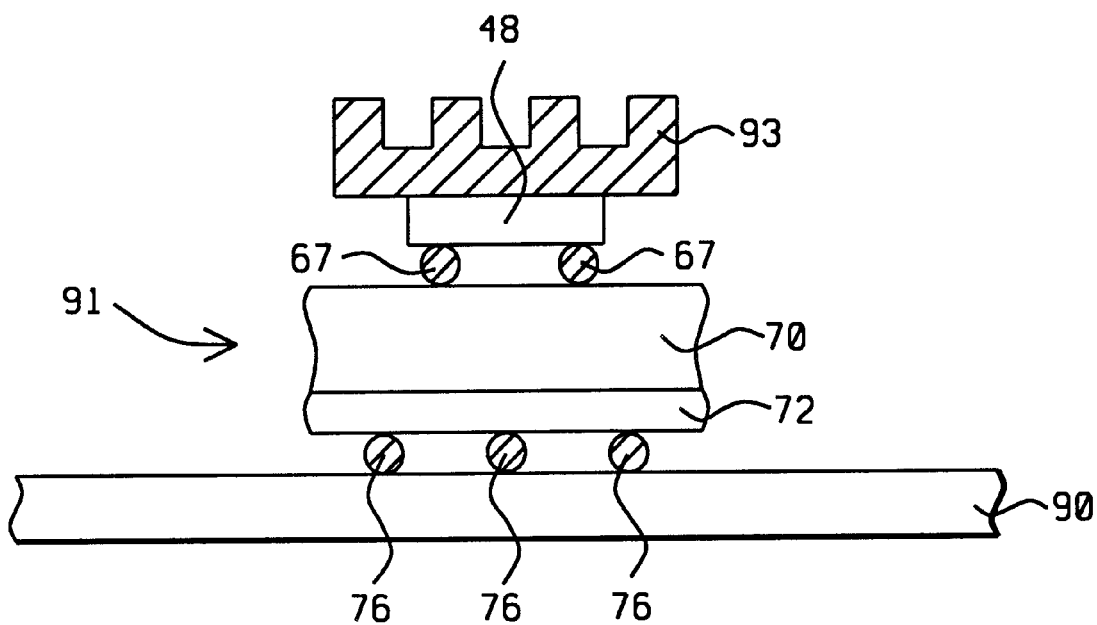
FIG. 19 shows a cross section where a heat spreader has been added over the active device.
Figure 20:
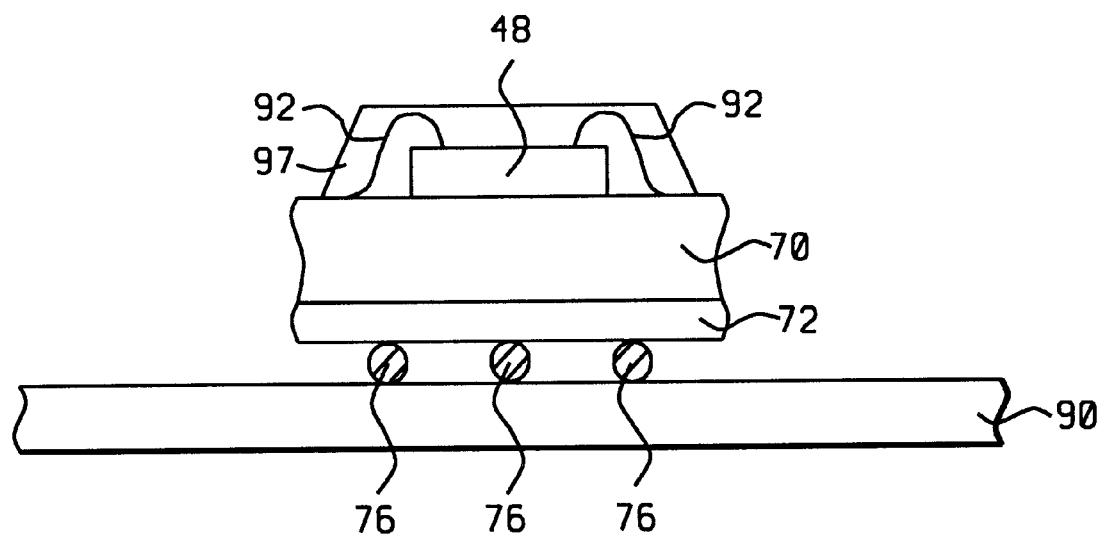
FIG. 20 shows a cross section whereby an active device is mounted over a device support surface such as the surface of a Printed circuit Board, the active device is turned upside down (flipped over).

It is further clear from the cross section that is shown in FIG. 10 that the surfaces of the semiconductor device 48 to which no solder balls are attached, as shown in cross section in FIG. 10, can readily be used for the attachments of one or more heat sinks. The surface that most lends itself to this purpose, in view of the fact that this surface has the largest surface area, is the surface that is opposite to the surface to which the solder balls 50' and 50" are attached (the upper surface whereby the surface to which the solder balls 50' and 50" are attached can be referred to as the lower surface). The (vertical) surfaces that connect the upper surface with the lower surface however can equally be used for the attachment of a heat sink, this heat sink may be one unit or it may contain more than one unit, each individually attached to any surface of semiconductor device 48 other than the surface to which the contact balls 50' and 50" are attached. Shown in FIG. 19 is a cross section of the SOP of the invention, comprising elements that have previously been highlighted. Added to FIG. 19 has been heat sink 93, which in this case has been attached to the surface of the active device 48 that is opposite to the side of the device to which the solder balls 50' and 50" have been attached. From the cross section that is shown in FIG. 19 it is further clear that the SOP 91 of the invention can be attached to a Printed Circuit Board 90 by connecting solder balls 76 with points of electrical contact (not shown in FIG. 19) that have been provided for this purpose in the surface of the PCB 90.

Where FIG. 19 shows an active semiconductor device 48 that has been provided with contact balls 67, the active device 48 can also be provided with contact pads for the purpose of establishing I/O interconnect with the active device. This has been shown in cross section in FIG. 20, where the active device is turned upside down (flipped over) so that the contact pads (not shown) face upwards or away from the SOP 70/72. In this application of the SOP of the invention, the active device 48 is connected to the SOP 70/72 by means of bond wires 92. The semiconductor device 48 and supporting bond wires 92 are encapsulated in a molding compound 97.

Figure 21:
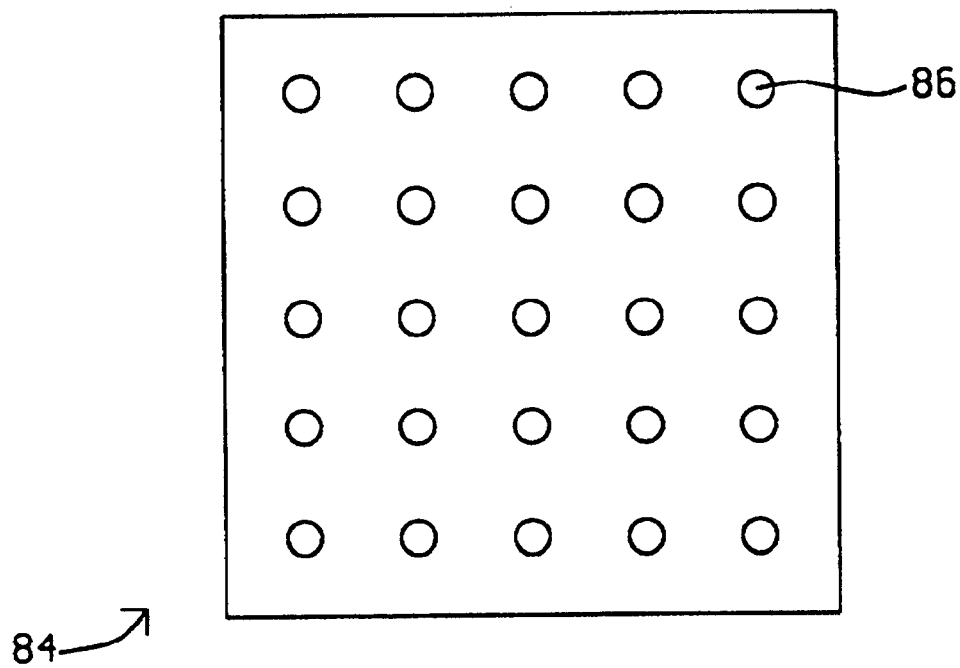
FIG. 21 shows a top view of square green sheet.

FIG. 21 shows a top view of square green sheet 84 with an array of holes 86.

Figure 22:
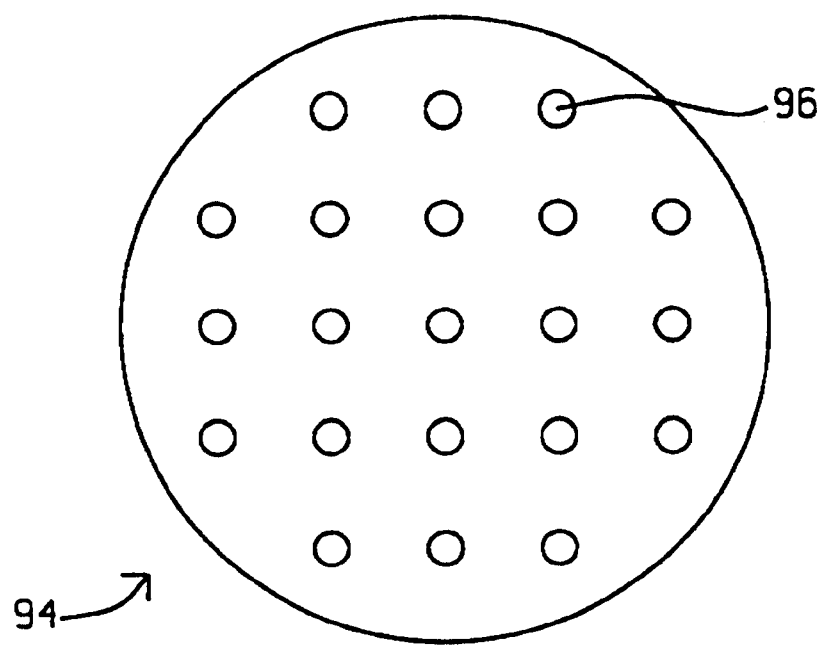
FIG. 22 shows a top view of round green sheet.

FIG. 22 shows a top view of round green sheet 94 with an array of holes 96.

The process flow of the invention for the three types of SOPs can be summarized as follows:

for the BGA package:
   providing a ceramic substrate that has been provided with an array of vias, the ceramic substrate has a lower (first) surface and an upper (second) surface
   creating layers of dielectric overlying the upper surface of the ceramic substrate, these layers to contain passive components on the surface of the layers of dielectric in addition to points of electrical interconnect (metal plugs), the layers of dielectric containing one last layer of dielectric which serves as a protective layer for the structure, points of electrical contact have been provided in the surface of the last layer of dielectric, the passive components being formed using thin film technology, interconnects having been provided for the passive components
   dividing (sawing) the ceramic substrate into individual units
   attaching active semiconductor devices to the surface of the last layer of dielectric attaching contact balls (BGA) to the first surface of the ceramic substrate.

for the PGA package, the sequence is as described above for the BGA package with the exception that the step of attaching contact balls (BGA) to the first surface of the ceramic substrate is replaced with the step of attaching PGA pins to the first surface of the ceramic substrate for the finger type package, the sequence is again the same as described above for the BGA package with the exception that the step of attaching contact balls (BGA) to the first surface of the ceramic substrate is eliminated, and the metal to the other fingers provide further interconnections.

It must be mentioned as a final point that green sheets, which are used for the creation of ceramic substrates, can be provided as square sheets, referred to as standardized panel type ceramic substrates, or as circular sheets, referred to as standardized wafer type ceramic substrates. In either form, the ceramic substrate can be processed as described above, using current semiconductor manufacturing equipment and processes. SOPs can be created from these sheets in accordance with the invention. In addition, a square type or circular type substrate can form the through holes in a standard pattern but personalized by the subsequent thin film process. Thus, the fabrication costs can be reduced due to the fact that standard tooling can be used for forming the through holes.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creation a System On Package, comprising the steps of:
   providing a ceramic substrate having a first and a second surface;
   providing conductive plugs through said ceramic substrate in a direction that is perpendicular to the surface of said ceramic substrate, establishing points of electrical contact on said first and said second surface of said ceramic substrate;
   depositing a first layer of dielectric over the second surface of said ceramic substrate; then
   creating conductive vias through said first layer of dielectric that align with said points of electrical contact in the second surface of said ceramic substrate; or
   creating passive components on the surface of said first layer of dielectric, using thin film technology; or
   creating interconnect metal on the surface of said first layer of dielectric, said interconnect metal establishing connection with said conductive vias or said passive components created on the surface of said first layer of dielectric; then
   depositing at least one additional layer of dielectric over the surface of said first layer of dielectric; then
   creating conductive vias through said additional layer of dielectric that align with said passive components or said interconnect metal or said conductive vias of said first layer of dielectric; or
   creating passive components on the surface of said additional layer of dielectric, using thin film technology; or
   creating interconnect metal on the surface of said additional layer of dielectric, said interconnect metal establishing connection with said via openings or said passive components created on the surface of said additional layer of dielectric;
   depositing a last layer of dielectric over the surface of said at least one additional layer of dielectric; and
   establishing points of electrical contact in the surface of said last layer of dielectric by creating vias through said last layer of dielectric.

2. The method of claim 1 with an additional step of positioning at least one semiconductor device having been provided with points of electrical contact above the surface of said last layer of dielectric and establishing electrical contact between said points of electrical contact of said at least one semiconductor device and said points of electrical contact established in the surface of said last layer of dielectric.

3. The method of claim 2 wherein said points of electrical contact having been provided in said at least one semiconductor device comprise solder balls, said establishing electrical contact between said points of electrical contact of said at least one semiconductor device and said points of electrical contact established in the surface of said last layer of dielectric comprising positioning said semiconductor device above the surface of said last layer of dielectric, said solder balls facing and making contact with said points of electrical contact in the surface of said last layer of dielectric and reflowing said solder balls.

4. The method of claim 2 wherein said points of electrical contact having been provided in said at least one semiconductor device comprise contact pads, said establishing electrical contact between said points of electrical contact of said at least one semiconductor device and said points of electrical contact established in the surface of said last layer of dielectric comprising positioning said semiconductor device above the surface of said last layer of dielectric, said contact pads of said semiconductor device being exposed and facing away from the surface of said last layer of dielectric, wire bonding said contact pads to said points of electrical contact provided in the surface of said last layer of dielectric.

5. The method of claim 1 wherein said dielectric comprises photosensitive polyimide.

6. The method of claim 1 wherein said passive components are selected from the group consisting of resistors, capacitors and inductors.

7. The method of claim 1 with an additional step of attaching solder balls to said points of electrical contact provided in said first surface of said ceramic substrate.

8. The method of claim 1 with an additional step of attaching metal pins to said points of electrical contact provided in said first surface of said ceramic substrate.

9. The method of claim 3 with the addition of the attachment of at least one heat sink to a surface of said at least one semiconductor device.

10. The method of claim 7 wherein said SOP is further mounted on the surface of a Printed Circuit Board whereby said first surface of said SOP faces the Printed Circuit Board, said solder balls being connected with points of electrical contact provided in the surface of said Printed Circuit Board.

11. The method of claim 8 wherein said SOP is further mounted on the surface of a Printed Circuit Board whereby said first surface of said SOP faces the Printed Circuit Board, said metal pins being connected with points of electrical contact provided in the surface of said Printed Circuit Board.

12. A method of creation a System On Package, comprising the steps of:

providing a ceramic substrate having a first and a second surface, said ceramic substrate having been provided with conductive plugs through said ceramic substrate in a direction that is perpendicular to the surface of said ceramic substrate, establishing points of electrical contact on said first and said second surface of said ceramic substrate;

depositing at least one layer of dielectric over the second surface of said ceramic substrate; then creating conductive vias through said at least one layer of dielectric that align with said points of electrical contact in the second surface of said ceramic substrate; or creating passive components on the surface of said at least one layer of dielectric, using thin film technology; or creating interconnect metal on the surface of said at least one layer of dielectric, said interconnect metal establishing connection with said conductive vias or said passive components created on the surface of said first layer of dielectric; then depositing a last layer of dielectric over the surface of said at least one additional layer of dielectric;

establishing points of electrical contact in the surface of said last layer of dielectric by creating vias through said last layer of dielectric.

13. The method of claim 12 with an additional step of positioning at least one semiconductor device having been provided with points of electrical contact above the surface of said last layer of dielectric and establishing electrical contact between said points of electrical contact of said at least one semiconductor device and said points of electrical contact established in the surface of said last layer of dielectric.

14. The method of claim 12 wherein said points of electrical contact having been provided in said at least one semiconductor device comprise solder balls, said establishing electrical contact between said points of electrical contact of said at least one semiconductor device and said points of electrical contact established in the surface of said last layer of dielectric comprising positioning said semiconductor device above the surface of said last layer of dielectric, said solder balls facing and making contact with said points of electrical contact in the surface of said last layer of dielectric and reflowing said solder balls.

15. The method of claim 13 wherein said points of electrical contact having been provided in said at least one semiconductor device comprise contact pads, said establishing electrical contact between said points of electrical contact of said at least one semiconductor device and said points of electrical contact established in the surface of said last layer of dielectric comprising positioning said semiconductor device above the surface of said last layer of dielectric, said contact pads of said semiconductor device being exposed and facing away from the surface of said last layer of dielectric, wire bonding said contact pads to said points of electrical contact provided in the surface of said last layer of dielectric.

16. The method of claim 12 wherein said at least one layer of dielectric comprises photosensitive polyimide.

17. The method of claim 12 wherein said passive components are selected from the group consisting of resistors, capacitors and inductors.

18. The method of claim 12 with an additional step of attaching solder balls to said points of electrical contact provided in said first surface of said ceramic substrate.

19. The method of claim 12 with an additional step of attaching metal pins to said points of electrical contact provided in said first surface of said ceramic substrate.

20. The method of claim 14 with the addition of the attachment of at least one heat sink to a surface of said at least one semiconductor device.

21. The method of claim 18 wherein said SOP is further mounted on the surface of a Printed Circuit Board, said first surface of said SOP facing the Printed Circuit Board, said solder balls being connected with points of electrical contact provided in the surface of said Printed Circuit Board.

22. The method of claim 19 wherein said SOP is further mounted on the surface of a Printed Circuit Board, said first surface of said SOP facing the Printed Circuit Board, said metal pins being connected with points of electrical contact provided in the surface of said Printed Circuit Board.

23. A System On Package, comprising:
- a ceramic substrate having a first and a second surface, said ceramic substrate having been provided with conductive plugs through said ceramic substrate in a direction that is perpendicular to the surface of said ceramic substrate, establishing points of electrical contact on said first and said second surface of said ceramic substrate;
- at least one layer of dielectric deposited over the second surface of said ceramic substrate;
- conductive vias created through said at least one layer of dielectric that align with said points of electrical contact in the second surface of said ceramic substrate; or
- passive components created on the surface of said at least one layer of dielectric, using thin film technology; or
- interconnect metal created on the surface of said at least one layer of dielectric, said interconnect metal establishing connection with said conductive vias or said passive components created on the surface of said first layer of dielectric;
- a last layer of dielectric deposited over the surface of said at least one additional layer dielectric;
- points of electrical contact established in the surface of said last layer of dielectric by creating vias through said last layer of dielectric.

24. The System On Package of claim 23 with an addition of at least one semiconductor device having been provided with points of electrical contact positioned above the surface of said last layer of dielectric, electrical contact having been established between said points of electrical contact of said at least one semiconductor device and said points of electrical contact established in the surface of said last layer of dielectric.

25. The System On Package of claim 24, said points of electrical contact having been provided in said at least one semiconductor device comprising solder balls, said semiconductor device having been positioned above the surface of said last layer of dielectric, said solder balls facing and making contact with said points of electrical contact in the surface of said last layer of dielectric, said electrical contact having been established between said points of electrical contact of said at least one semiconductor device and said points of electrical contact established in the surface of said last layer of dielectric by reflowing said solder balls.

26. The System On Package of claim 24, said points of electrical contact having been provided in said at least one semiconductor device comprising contact pads, said semiconductor device having been positioned above the surface of said last layer of dielectric, said contact pads of said semiconductor device being exposed and facing away from the surface of said last layer of dielectric, electrical contact having been established between said points of electrical contact of said at least one semiconductor device and said points of electrical contact established in the surface of said last layer of dielectric comprising by wire bonding said contact pads to said points of electrical contact provided in the surface of said last layer of dielectric.

27. The System On Package of claim 23, said at least one layer of dielectric comprising photosensitive polyimide.

28. The System On Package of claim 12, said passive components being selected from the group consisting of resistors, capacitors and inductors.

29. The System On Package of claim 23 with the addition of attaching solder balls attached to said points of electrical contact provided in said first surface of said ceramic substrate.

30. The System On Package of claim 23 with the addition of metal pins attached to said points of electrical contact provided in said first surface of said ceramic substrate.

31. The System On Package of claim 25 with the addition of at least one heat sink attached to a surface of said at least one semiconductor device.

32. The System On Package of claim 29 wherein said SOP is further mounted on the surface of a Printed Circuit Board, said first surface of said SOP facing the Printed Circuit Board, said solder balls being connected with points of electrical contact provided in the surface of said Printed Circuit Board.

33. The System On Package of claim 30 wherein said SOP is further mounted on the surface of a Printed Circuit Board, said first surface of said SOP facing the Printed Circuit Board, said metal pins being connected with points of electrical contact provided in the surface of said Printed Circuit Board.

34. The method of claim 1, with an additional step of connecting metal fingers to said points of electrical contact provided in said first surface of said ceramic substrate.

35. The System on Package of claim 23, with additionally metal fingers attached to said points of electrical contact provided in said first surface of said ceramic substrate.

36. The System on Package of claim 23, wherein said SOP is further mounted to a connector of a card or module, said metal fingers being connected with points of electrical contact provided in a connector of said card or module.

37. The method of claim 1, a green sheet being used for creation of said ceramic substrate, said green sheet being a circular or square panel, said green sheet having been provided with arrays of through holes.

38. The method of claim 12, a green sheet being used for creation of said ceramic substrate, said green sheet being a circular or square panel, said green sheet having been provided with arrays of through holes.

* * * * *